United States Patent [19]

Nagashima

[11] Patent Number: 5,287,324
[45] Date of Patent: Feb. 15, 1994

[54] MULTIPORT DRAM

[75] Inventor: Ichiro Nagashima, Yokohama, Japan

[73] Assignee: Kabushiki Kaisha Toshiba, Kawasaki, Japan

[21] Appl. No.: 858,090

[22] Filed: Mar. 26, 1992

[30] Foreign Application Priority Data

Mar. 29, 1991 [JP] Japan .................................. 3-067265

[51] Int. Cl.⁵ .............................................. G11C 8/00
[52] U.S. Cl. .......................... 365/230.05; 365/230.09; 365/239
[58] Field of Search ..................... 365/189.12, 230.05, 365/230.09, 239, 240

[56] References Cited

U.S. PATENT DOCUMENTS 5,001,672  3/1991  Ebbers et al. ................... 365/230.05
5,065,368  11/1991 Gupta et al. .................... 365/230.05

Primary Examiner—Eugene R. LaRoche
Assistant Examiner—Andrew Tran
Attorney, Agent, or Firm—Foley & Lardner

[57] ABSTRACT

A multiport DRAM having a DRAM cell array; a sequential access memory (SAM) for inputting data of a specific length to the DRAM cell array and transmitting that data to an external device; a SAM address counter for counting the addresses of the data in the SAM; a serial port connected to the SAM for transmitting the data in the SAM to an external device; a data transfer address counter, the contents of which is cleared by inputting an external reset signal and is counted up by inputting an overflow signal which is output from the SAM address counter; and a data transfer controller for outputting a data transfer status signal which indicates that data transmission is in progress when data of a specific length in the DRAM cell array designated by the input of the overflow signal by the data transfer address counter is transmitted to the SAM.

3 Claims, 11 Drawing Sheets

MULTIPORT DRAM

BACKGROUND OF THE INVENTION

1. Field of the Invention

The present invention relates to a display memory for storing data to be displayed by a monitor, and, in particular, to a display memory such as a multiport DRAM comprising a frame buffer.

2. Description of the Prior Art

A conventional multiport DRAM, as shown in FIG. 1, for example, is provided with two ports, a serial port PS and a random port PR, and is constructed so that access to a desired address is obtained by an address signal SA.

In a multiport DRAM 101 of this type it is necessary to input an address value from an external source as the address signal SA for specifying a row to be transmitted from a DRAM cell array 3 to a SAM 9 during data transfer.

In addition, in a display system using the multiport DRAM 101 as shown in FIG. 2, when the address value is input to the multiport DRAM 101, an address ADT for data transfer transmitted from a display control unit 73 and an image address ADR for random access transmitted from an image control unit 71 must be selected by a multiplexer 111 because the random access address input signal terminal PR is used.

Accordingly, a multiplexer is required for the data transfer address and the random access address and a circuit is required for control and the like of the multiplexer. A large system is therefore required.

In addition, a delay, specifically, a gate delay is produced in the signal transmission in the multiplexer or multiplexer control system.

This is an obstacle to high speed memory access of the image control unit 71. Specifically, it is difficult to process the image. As outlined above, in order to use one address input signal terminal for both random access and data transfer with a conventional multiport DRAM when the DRAM is incorporated in a display system, a circuit and a multiplexer are necessary to multiplex and control a display system address ADT and an image control address ADT. For this reason the scale of the system is large and, in addition, it is difficult to convert to high speed image processing.

SUMMARY OF THE INVENTION

An object of the present invention is to provide, with due consideration to the drawbacks of such conventional devices, a multiport DRAM wherein a multiplexer is not required for a display system address and an image system address so that the number of circuits in the system is reduced and high speed processing becomes possible.

A multiport DRAM, as a preferred embodiment according to the present invention, comprises:

a DRAM cell array;

a sequential access memory (SAM) for inputting data of a specific length to the DRAM cell array and transmitting that data to an external device;

a SAM address counter for counting the addresses of the data in the SAM;

a serial port connected to the SAM for transmitting the data in the SAM to an external device;

a data transfer address counter, the contents of which is cleared by inputting an external reset signal and is counted up by inputting an overflow signal which is output from the SAM address counter; and a data transfer control unit for outputting a data transfer status signal which indicates that data transmission is in progress when data of a specific length in the DRAM cell array designated by the input of the overflow signal by the data transfer address counter is transmitted to the SAM.

A multiport DRAM, as another preferred embodiment according to the present invention, comprises:

a DRAM cell array;

a sequential access memory (SAM) for inputting data of a specific length to the DRAM cell array and transmitting that data to an external device;

a SAM address counter for counting the addresses of the data in the SAM;

a serial port connected to the SAM for transmitting the data in the SAM to an external device;

a data transfer address counter, comprising an upper field and a lower field, the content of which is cleared by the input of an external reset signal and is counted up by means of an external data transfer request signal;

a data transfer control unit which, when the data transfer request signal is input, transmits the data contained in the DRAM specified in the upper field of the data transfer address counter to the SAM, outputs to an external device a data transfer status signal which shows that data is being transferred, and controls the setting of the initial value of a transmission starting address in the SAM address counter in the lower field of the data transfer address counter.

A multiport DRAM, as another preferred embodiment according to the present invention, comprises:

a DRAM cell array;

a sequential access memory (SAM) for entering data of a specific length into the DRAM cell array and transmitting that data to an external device;

a SAM address counter for counting the addresses of the data in the SAM;

a serial port connected to the SAM for transmitting the data in the SAM to an external device;

a data transfer address counter, comprising an upper field and a lower field, the contents of which is cleared by the input of an external reset signal and is counted up by inputting an external data transfer request signal transmitted from the external device or by inputting an overflow signal transmitted from the SAM address counter;

a selection means for selecting the external data transfer request signal or the overflow signal which is transferred to the data transfer address counter;

a data transfer control unit which, when the data transfer request signal or the overflow signal which is selected by the selection means is input, transmits the data of a specific length in the DRAM cell array, specified in the upper field of the data transfer address counter to the SAM, outputs to an external device a data transfer status signal which shows that data is being transferred, and controls the setting of the initial value of a transmission starting address in the SAM address counter in the lower field of the data transfer address counter.

BRIEF DESCRIPTION OF THE DRAWINGS

These and other objects, features, and advantages of the present invention will become more apparent from the following description of the preferred embodiment taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

An embodiment of the present invention will now be explained, based on the drawings.

Figure 1:
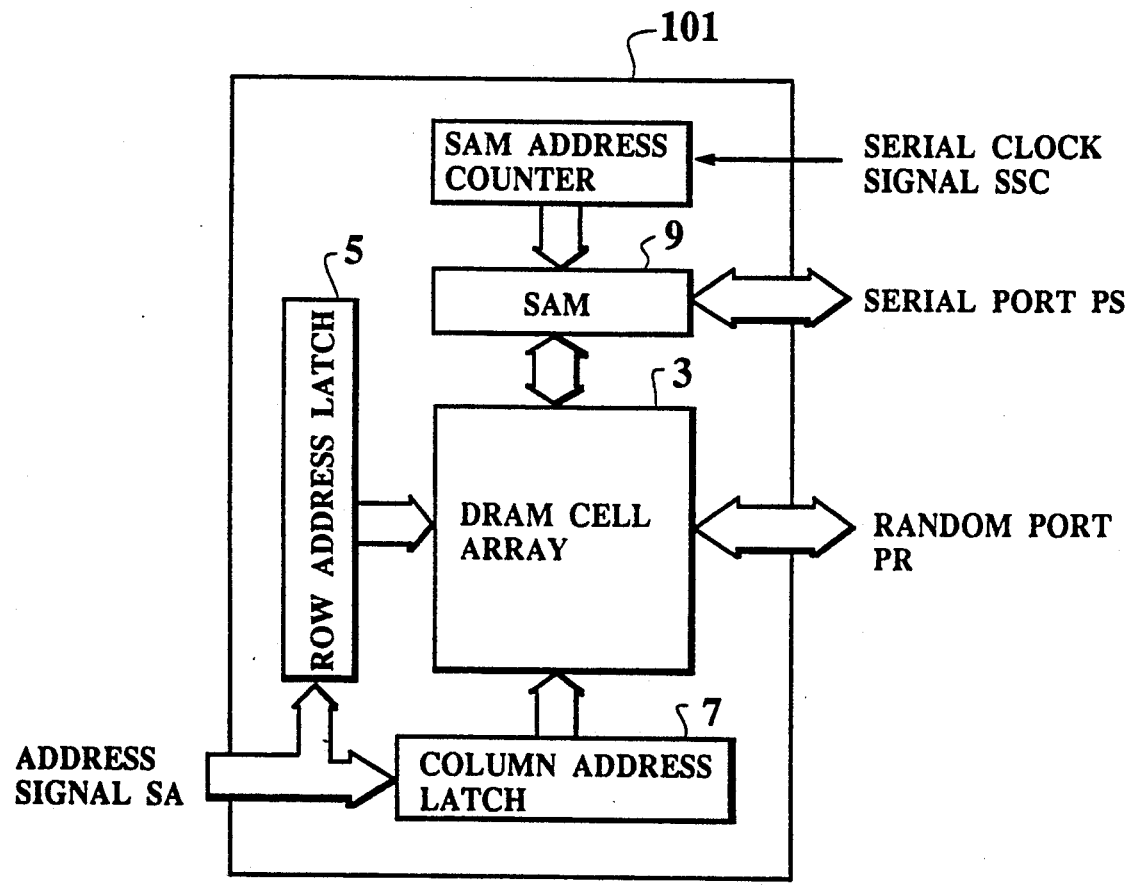
FIG. 1 is a configuration drawing of a conventional multiport DRAM.
Figure 2:
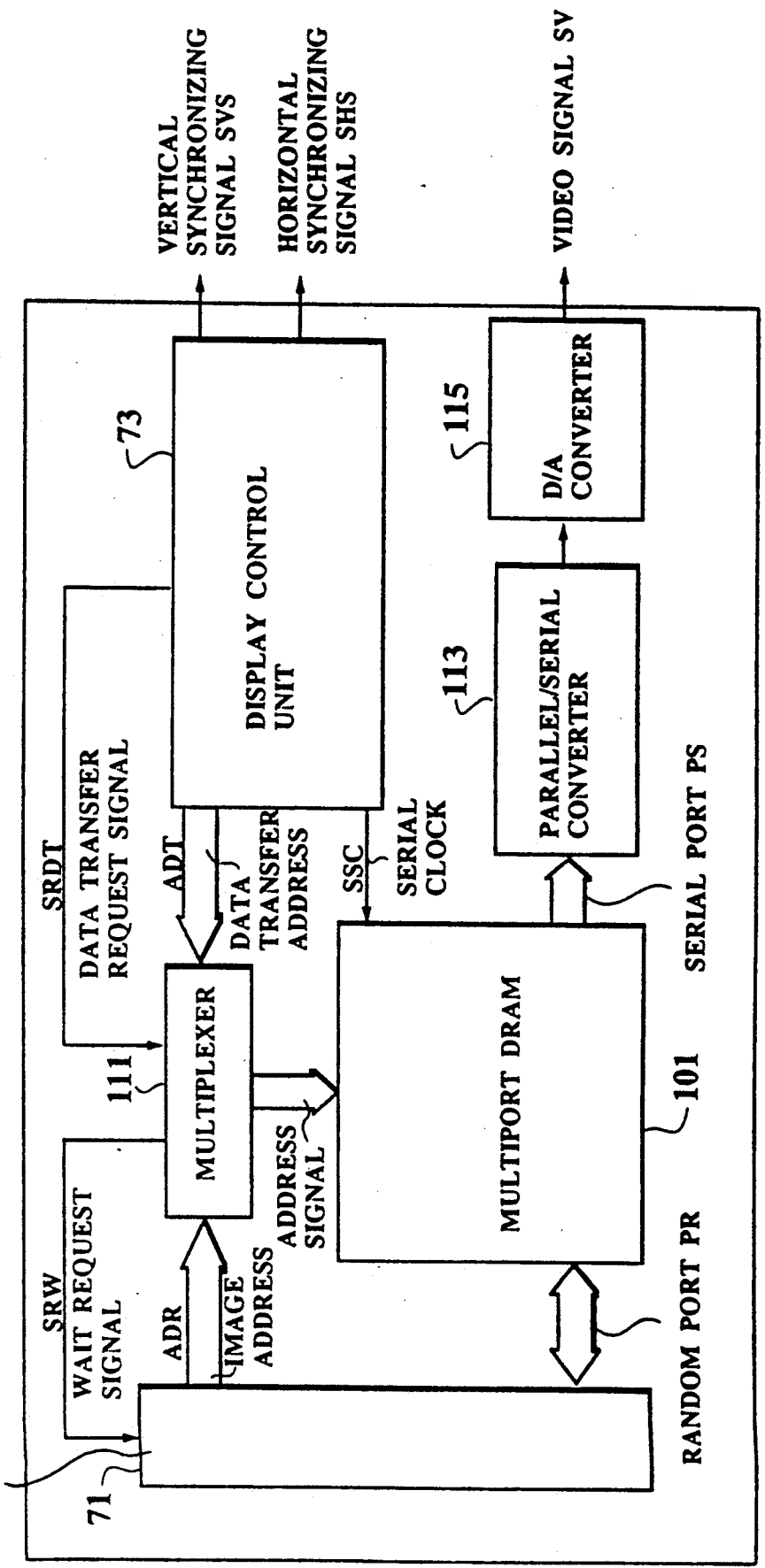
FIG. 2 is a configuration drawing of a display system using a conventional multiport DRAM.
Figure 3:
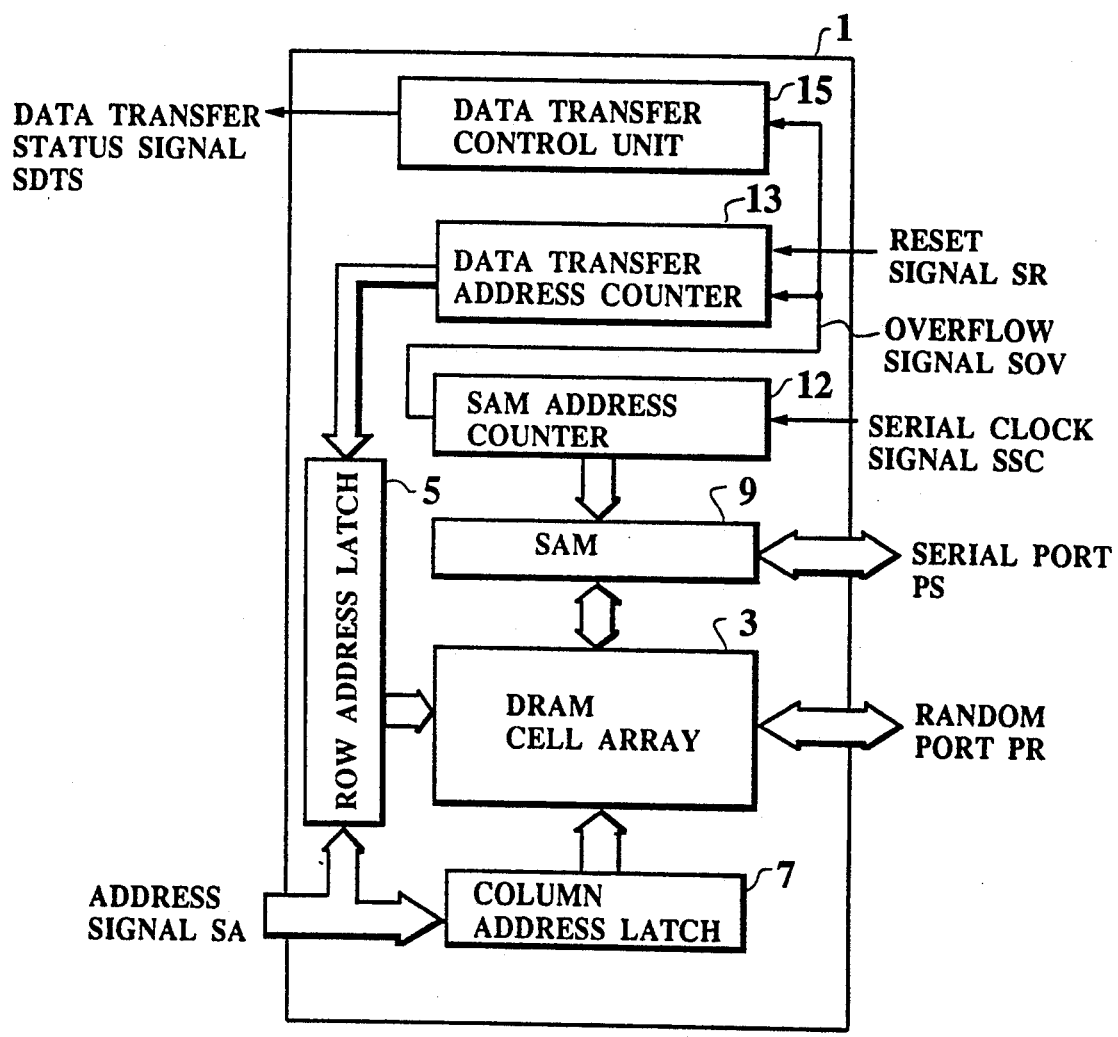
FIG. 3 is a configuration drawing of a first embodiment of a multiport DRAM of the present invention.

FIG. 3 is a configuration drawing of a first embodiment of a multiport DRAM of the present invention. A DRAM cell array 3, a row address latch 5, a column address latch 7, a SAM 9, a SAM address counter 12, and address signal SA, a serial port PS, and a random port PR are the same as used in the conventional example (FIG. 1) and have therefore been assigned the same reference numerals. In FIG. 3, a data transfer address counter 13 is cleared on the input of a reset signal SR from an external source. As a result, if such an external reset signal SR is input each time a display of one frame is completed, it is possible to refresh the display device and scan the frame memory synchronously.

In addition, the SAM address counter 12 is incremented by the input of a serial clock signal SSC, and when a specified value is exceeded an overflow signal SOV is output and the data transfer address counter 13 is incremented. As a result, when all the data in the SAM 9 is output, the contents of the data transfer address counter 13 designate the next row address to be read. In addition, the overflow signal SOV is also transmitted to a data transfer control unit 15 and triggers the transfer operation. At this time, the contents of the data transfer address counter 13 are loaded into the row address latch 5 and the contents of the row address of the DRAM cell array 3 indicated by the data transfer address counter 13 are transferred to the SAM 9.

As a result, the contents of the DRAM cell array 3 can be output from the serial port PS sequentially, and the display device is refreshed. During the transfer operation the DRAM 3 cannot be accessed through the random port PR. The data transfer control unit 15 therefore outputs a data transfer status signal SDTS to an external device to alert the external image control section and the like.

Figure 4:
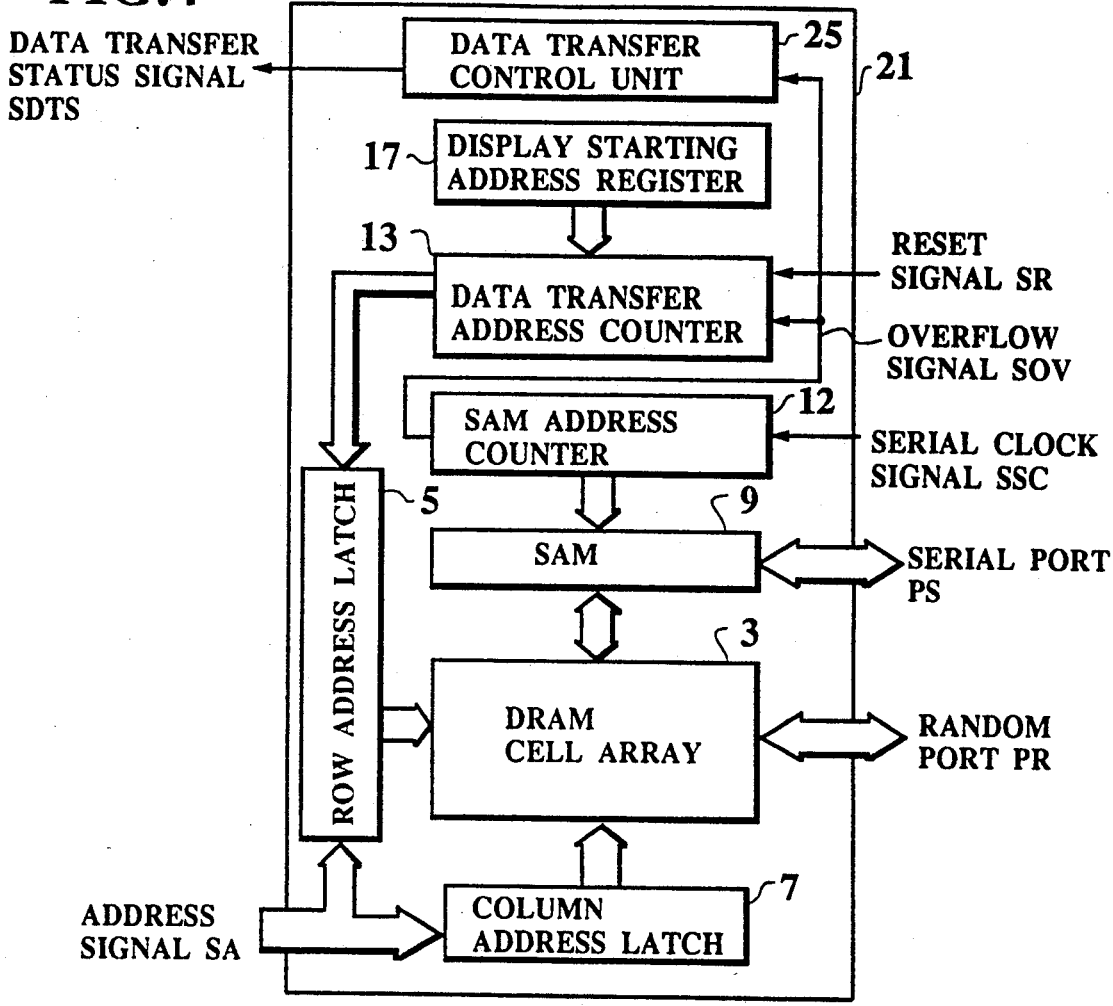
FIG. 4 is a configuration drawing of a second embodiment of a multiport DRAM of the present invention.
Figure 4:
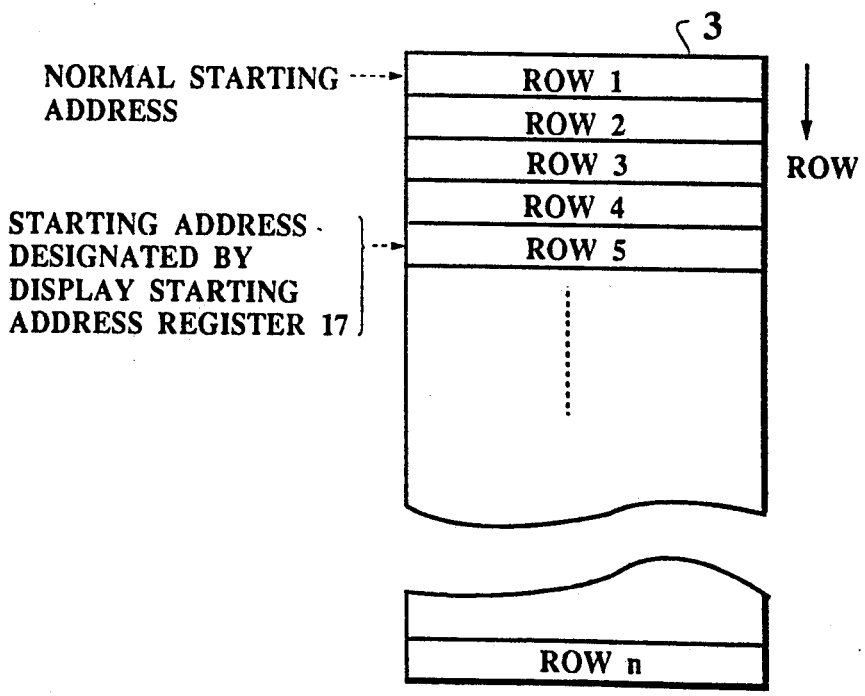

FIG. 4 is a configuration drawing of a second embodiment of the present invention. This second embodiment has the same configuration as the first embodiment except that it also comprises a display starting address register 17. The display starting address register 17 stores a display starting address at which a read-out from a specified row in the DRAM cell array is started and which can be displayed in the display device. When the reset signal SR is input, the data transfer address counter 13 loads the contents of the display starting address register 17. The operation of the other structural elements is the same as in the first embodiment.

Figure 5:
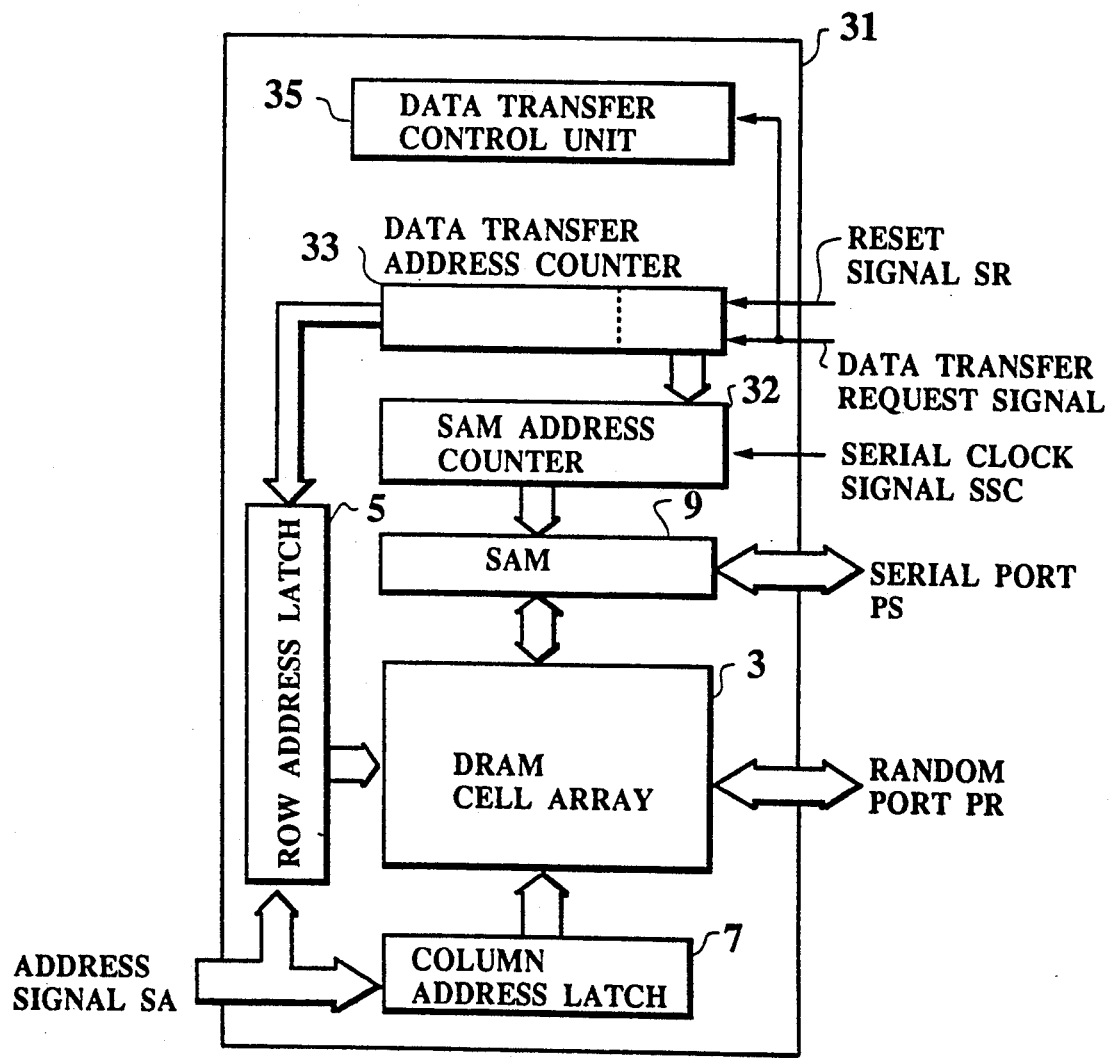
FIG. 5 is a configuration drawing of a third embodiment of a multiport DRAM of the present invention.
Figure 6:
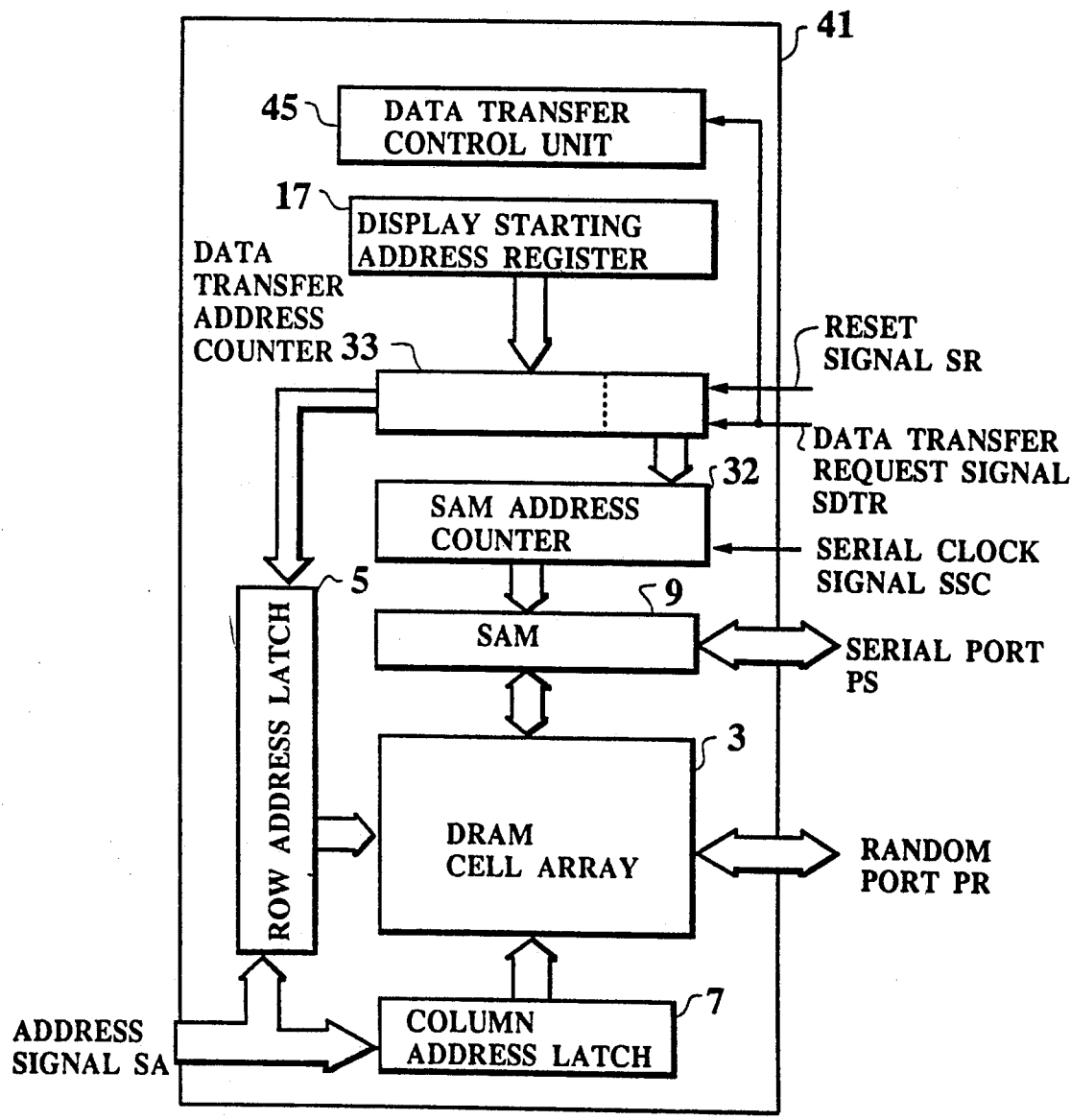
FIG. 6 is a configuration drawing of a fourth embodiment of a multiport DRAM of the present invention.

FIG. 5 and FIG. 6 are configuration drawings of third and fourth embodiments respectively of the multiport DRAM of the present invention. In these drawings, the configurations of the DRAM cell array 3, the row address latch 5, the column address latch 7, the SAM 9, the address signal SA, the serial port PS, the random port PR, the serial clock signal SSC, the reset signal SR, and the display starting address register 17 are the same as in the first and second embodiments and have therefore been assigned the same reference numerals. A data transfer request signal SDTR starts an increment and decrement control unit 35 (FIG. 5) or 45 (FIG. 6) for a data transfer address counter 33. In addition, during the communication operation, not only is the row specified by the contents of the data transfer address counter 33, but also the address of the row to be read out is specified by the contents of the upper field of the data transfer address counter 33, and the read-out starting address in the SAM 9 is specified by inputting the contents of the lower field of the data transfer address counter 33 to the high order of a SAM address counter 32. Specifically, a serial output is performed from the top.

In this manner, a horizontal synchronizing signal or a divided signal from the horizontal synchronizing signal is used as the data transfer request signal SDTR for controlling the display device. If this signal is input from an external device, data other than display data stored in the SAM 9 can be discarded, and it is possible to provide a system in which the display width and the frame memory width differ.

Figure 7:
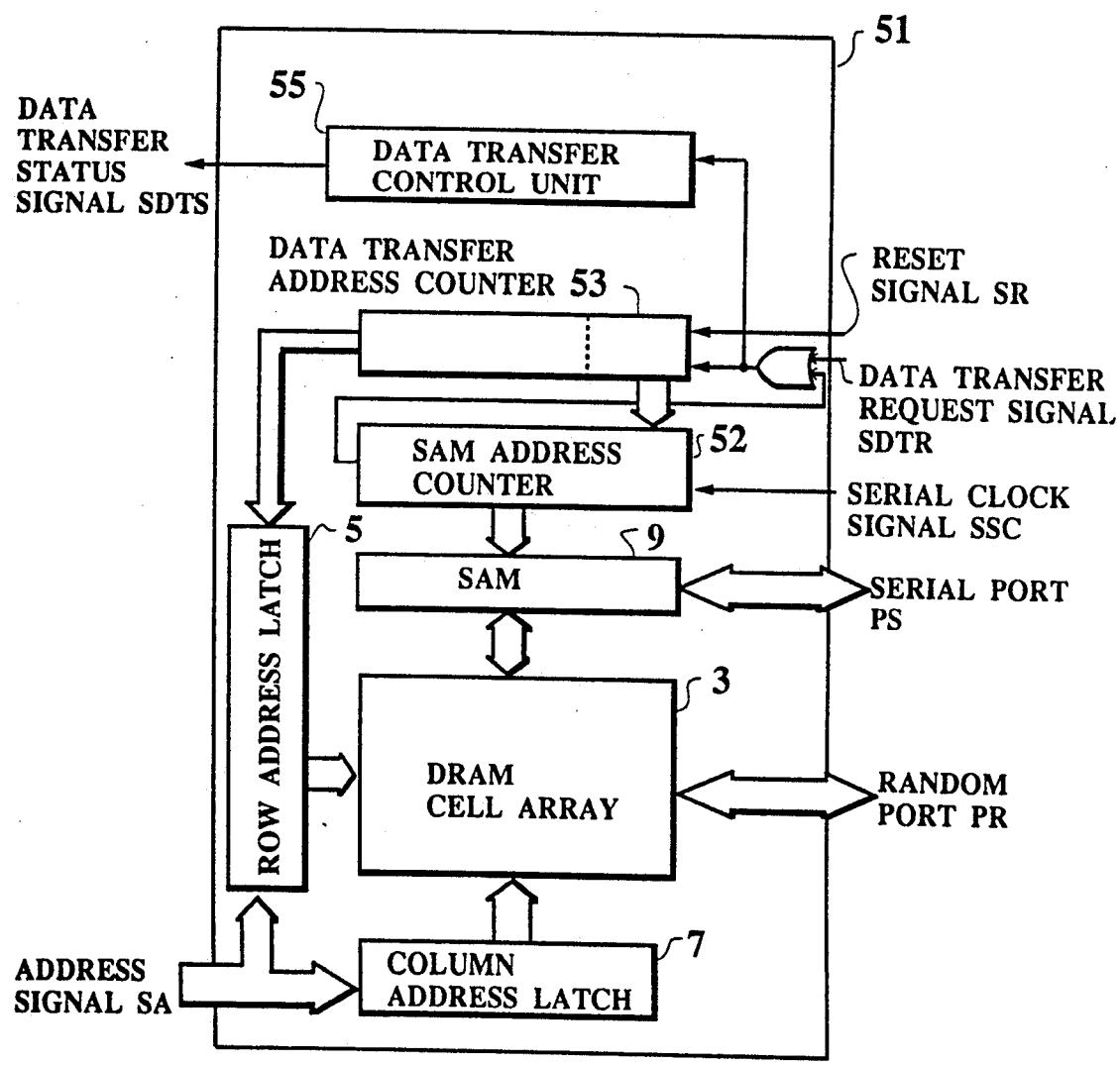
FIG. 7 is a configuration drawing of a fifth embodiment of a multiport DRAM of the present invention.
Figure 8:
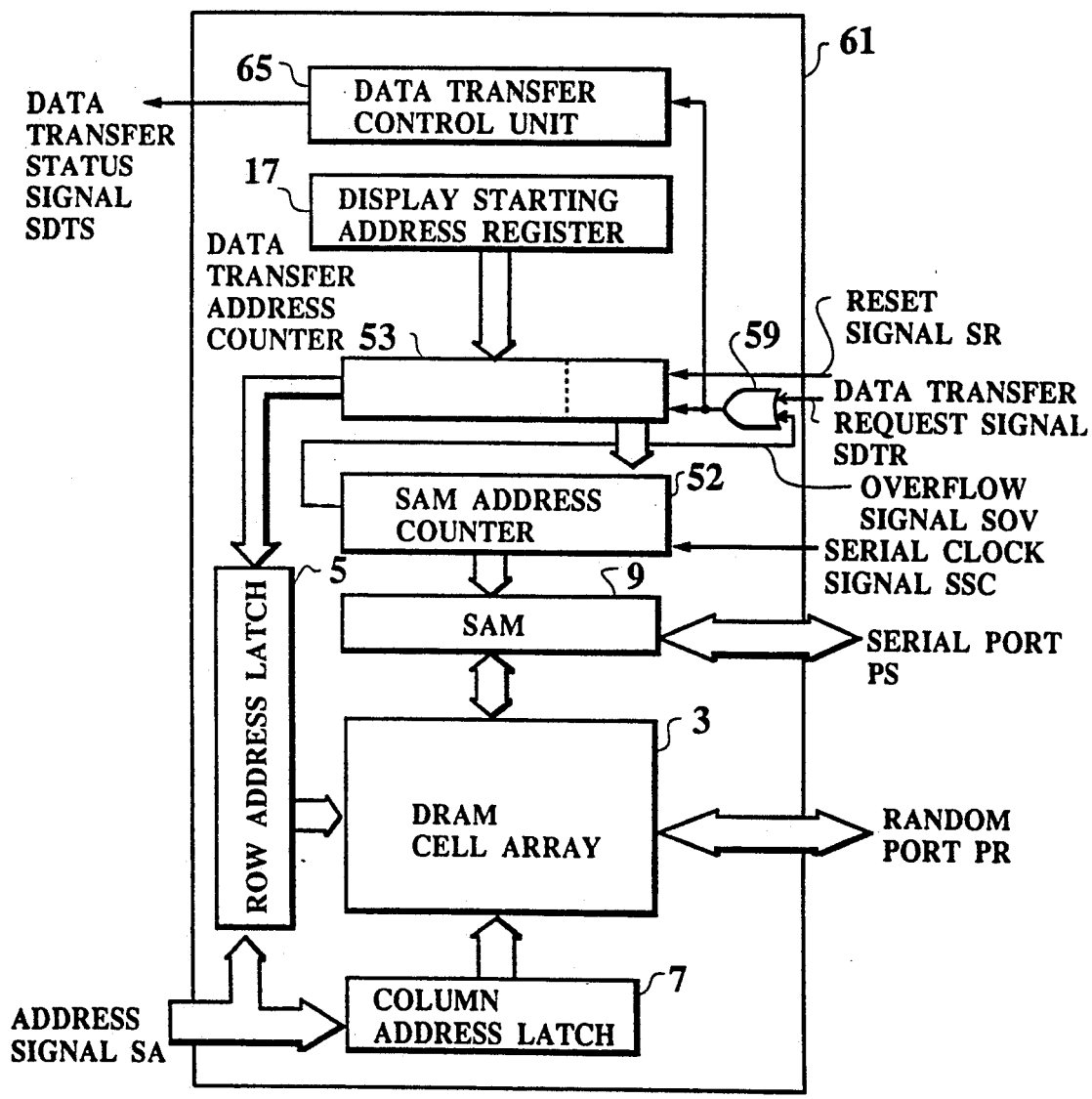
FIG. 8 is a configuration drawing of a sixth embodiment of a multiport DRAM of the present invention.

FIG. 7 and FIG. 8 are configuration drawings of fifth and sixth embodiments respectively of the multiport DRAM of the present invention. In these drawings, the configurations of the DRAM cell array 3, the row address latch 5, the column address latch 7, the SAM 9, the address signal SA, the serial port PS, the random port PR, the serial clock signal SSC, the reset signal SR, the display starting address register 17, and the data transfer request signal SDTR are the same as in the first, second, third and fourth embodiments and have therefore been assigned the same reference numerals. In these embodiments, a logical OR operation is carried out on the logical overflow signal SOV from a SAM address counter 52 and the data transfer request signal SDTR for starting signals for increment and decrement control units 55 and 65 for a data transfer address counter 53.

As a result, if the data transfer request signal SDTR is input prior to the completion of the serial output of the contents of the SAM 9, it is possible for the untransmitted data remaining in the SAM 9 to be discarded, and it is therefore possible to provide a system in which the display width and the frame memory width differ. This is the same function as that of the multiport DRAMs 31, 41 of the third and fourth embodiments. If the data transfer request signal SDTR is not input, when the serial output of the contents of the SAM 9 has been completed the transmission operation is started automatically and it is therefore possible to provide a system in which the display width and the frame memory width are in agreement. This is the same function as that of the multiport DRAMs 1, 21 of the first and second embodiments.

Figure 9:
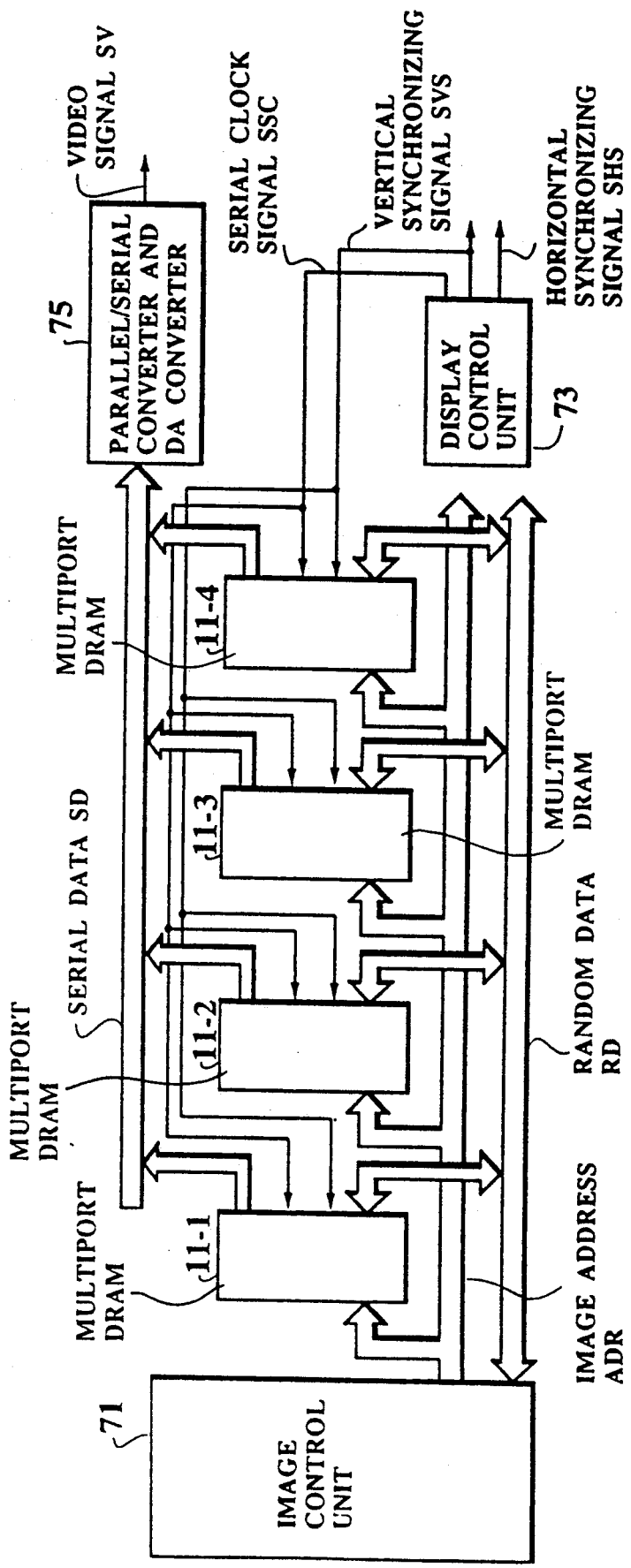
FIG. 9 is a configuration drawing of a display system using the first or second embodiment of a multiport DRAM of the present invention.

FIG. 9 illustrates a display system for the multiport DRAMs 1, 21 of the first and second embodiments. In this embodiment, for example, the screen size is 1152 mm×900 mm with 16 color gradations, and the frame memory comprises four 256K multiport DRAM for a four-way interleaved configuration, so that the display width and the frame width are identical at 1152 pixels. With this configuration, by inputting vertical synchronizing signals SVS from a display control unit 73 as the reset signals SR for multiport DRAMs 11-1 to 11-4, the display system can be constructed with extreme ease. Specifically, at the start of the display, the data transfer address counter 13 is cleared on inputting the vertical synchronizing signals SVS or the contents of the display starting address register 17 are loaded.

Accordingly, the contents of the row address initially displayed are transmitted to the SAM 9. Following this, when a scan of 2048 pixels is made, the page size for each memory is 512 pixels, and because there are four banks of frame memory, the serial output of the contents of the SAM 9 is completed for each memory. At this time an overflow occurs in the SAM address counter 12, so when the data transfer address 13 is incremented, data is transmitted to the row address in the SAM 9 designated by this operation and the subsequent data is output serially through the serial port PS. This operation is performed to produce 2048 pixels at a time, and the data from the succeeding addresses is output serially from the serial port PS in sequence.

Finally, when the scanning of one frame has been completed, the vertical synchronizing signal SVS is output from the display control unit 73. Therefore, if the signal SVS is input as the reset signal SR, the contents of the data transfer address 13 are returned to the original state and the data from the display starting address is once again output serially from the serial port PS. The display device is refreshed by means of the above-mentioned operation.

Figure 10:
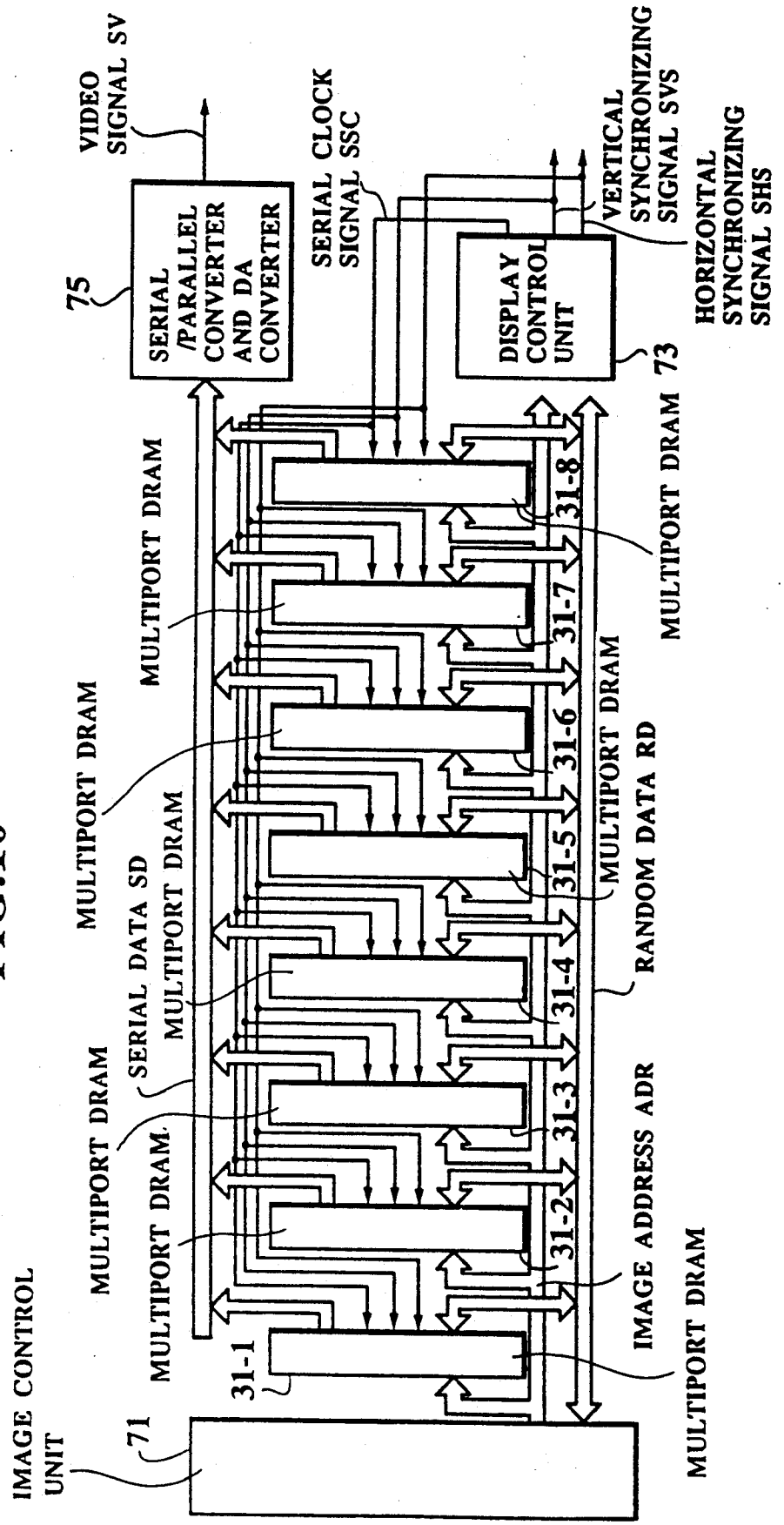
FIG. 10 is a configuration drawing of a display system using the third or fourth embodiment of a multiport DRAM of the present invention.
Figure 11:
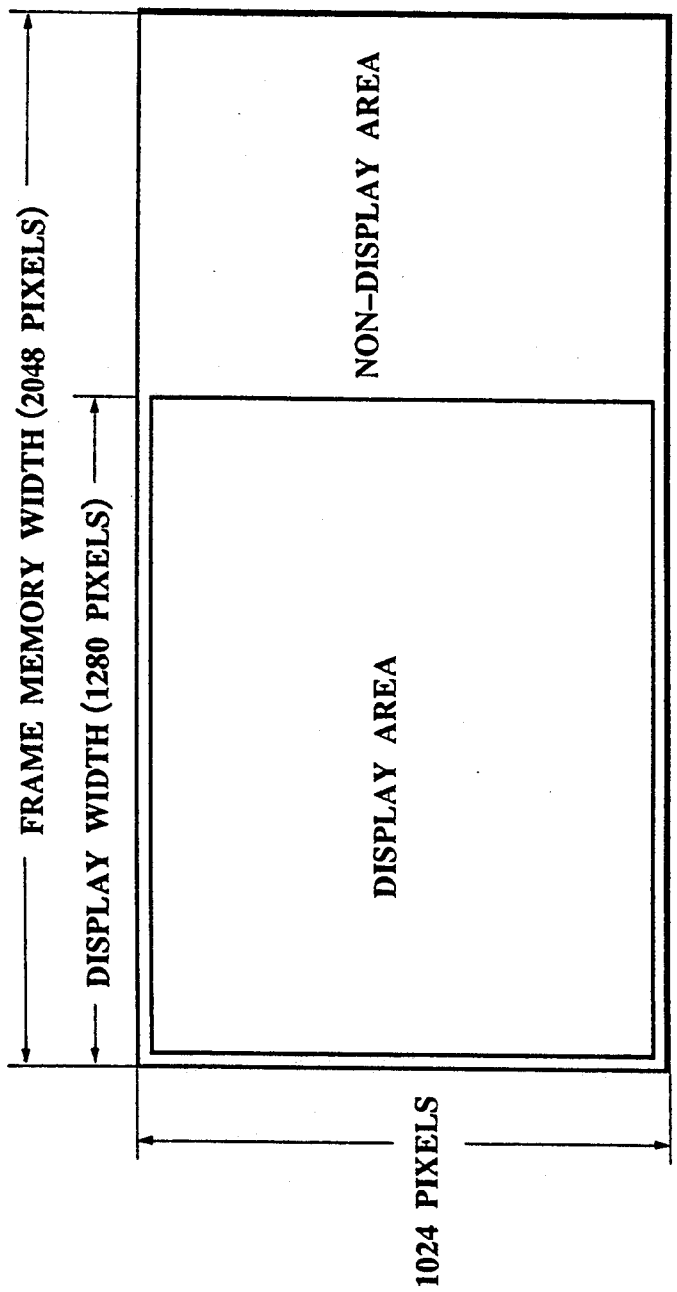
FIG. 11 is a drawing for explaining the screen size of the display system of FIG. 10.

Next, FIG. 10 illustrates a display system used in the third or fourth embodiment of the multiport DRAM of the present invention. For this embodiment, as shown in FIG. 11, the screen size is 1280 mm×1024 mm with 16 color gradations, and the frame memory comprises four 256K multiport DRAM for a 8-way interleaved configuration, so that the display width is 1280 pixels and the frame width is 2048 pixels in this example. With such a configuration, vertical synchronizing signals SVS are input as the reset signals SR and horizontal synchronizing signals SHS are input from the display control unit 73 as the data transfer request signals SR respectively for multiport DRAMS 31-1 to 31-8. By specifying the row to be transferred by the upper 8 bits and by initially setting the SAM address counter 32 by the lower bit of the data transfer address counter 33, the display system can be constructed with extreme ease. Specifically, at the start of the display, the data transfer address counter 33 is cleared or the contents of the display starting address register 17 are loaded by the input of the vertical synchronizing signal SVS.

Accordingly, the contents of the address of the initial row to be displayed are transmitted to the SAM 9. Following this, when a scan of 2048 pixels has been made and a scan of the first horizontal line of the display has been completed, a horizontal synchronizing signal SHS is output from the display control unit 73 and a data transfer request is made. Then, when the data transfer address counter 33 is incremented, the contents of the row address thus specified are transmitted to the SAM 9. However, because the specification of the row is carried out by the upper eight bits of the data transfer address counter 33, this is the same as the previously transmitted row, and the contents of the lowest bit of the data transfer address counter 33 are input to the uppermost position of the SAM address counter 32.

In addition to this, the bit is cleared so that data is output serially from the issuing address through the serial port PS up to a frame memory width of 2048 pixels. Next, when an advance of one horizontal line is made and a data transfer request is output, the data transfer address counter 33 is once more incremented so that the next row is specified. Then, the lowermost bit is cleared so that, as previously explained, data indicated by address of a next frame memory is output serially from the serial port PS. This operation is repeated for each advance of one horizontal line, the undisplayed area on the frame memory is skipped, and the display data is once again output serially from the serial port PS.

Finally, when the scanning of one frame has been completed, a vertical synchronizing signal SVS is output from the display control unit 73, so that if the signal SVS is input as the reset signal SR, the contents of the data transfer address 13 are returned to the original state and the data from the display starting address is once again output serially from the serial port PS. As previously explained, the display device is refreshed by means of the above-mentioned operation.

As explained in the foregoing, in the present invention the multiport DRAM provided with a serial port for images, comprises a function for maintaining a display starting address, an address counter for receiving an externally generated reset signal for resetting the display starting address, and a function for automatically performing data transfer according to the contents of the address counter, so that it is unnecessary to input a data transfer address from the display control unit, thus providing a reduction in the circuitry of the system.

In addition, because it is unnecessary to multiplex an address signal for the display system and imaging system, a signal delay, specifically a gate delay, using a multiplexer is eliminated. It is therefore possible to easily provide a multiport DRAM for providing a high speed image unit for the frame memory.

What is claimed is:

1. A multiport DRAM comprising:
   a DRAM cell array;
   a sequential access memory (SAM) for inputting data of a specific length to the DRAM cell array and transmitting that data to an external device;
   a SAM address counter for counting the addresses of the data in the SAM;
   a serial port connected to the SAM for transmitting the data in the SAM to an external device;

a data transfer address counter, the contents of which is cleared by inputting an external reset signal and is counted up by inputting an overflow signal which is output from the SAM address counter; and a data transfer control unit for outputting a data transfer status signal which indicates that data transmission is in progress when overflow data corresponding to said overflow signal in the DRAM cell array designated by the data transfer address counter is transmitted to the SAM.

2. A multiport DRAM according to claim 1, further comprising a display starting address register for specifying a starting address for transmitting data of a specific length in the DRAM cell array to the SAM, wherein the data transfer address counter, loads the display starting address into the display initiating address register on further input of an external reset signal.

3. A multiport DRAM according to claim 1, wherein data of a specific length transmitted from the DRAM cell array to the SAM is equivalent to the data in a row of the DRAM cell array.

* * * * *